(12) United States Patent
Benveniste et al.

(10) Patent No.: US 7,550,751 B2
(45) Date of Patent: Jun. 23, 2009

(54) ION BEAM SCANNING CONTROL METHODS AND SYSTEMS FOR ION IMPLANTATION UNIFORMITY

(75) Inventors: Victor M. Benveniste, Gloucester, MA (US); Edward C. Eisner, Lexington, MA (US); Bo H. Vanderberg, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 115 days.

(21) Appl. No.: 11/784,709

(22) Filed: Apr. 9, 2007

(65) Prior Publication Data

US 2008/0067444 A1    Mar. 20, 2008

Related U.S. Application Data

(60) Provisional application No. 60/790,751, filed on Apr. 10, 2006.

(51) Int. Cl.
*H01J 37/08* (2006.01)
(52) U.S. Cl. .............. 250/492.21; 250/286; 250/396 R; 250/492.2; 250/492.3
(58) Field of Classification Search ............ 250/492.21, 250/492.1, 491.1; 427/523
See application file for complete search history.

(56) References Cited

U.S. PATENT DOCUMENTS

| 6,677,598 | B1 | 1/2004 | Benveniste | |
|---|---|---|---|---|
| 6,710,359 | B2 | 3/2004 | Olson et al. | |
| 6,903,350 | B1 | 6/2005 | Vanderberg et al. | |
| 7,078,707 | B1 * | 7/2006 | Benveniste et al. | 250/491.1 |
| 2004/0256573 | A1 * | 12/2004 | Mollica | 250/492.1 |
| 2006/0006346 | A1 * | 1/2006 | Rathmell et al. | 250/492.21 |
| 2006/0057303 | A1 * | 3/2006 | Agarwal et al. | 427/523 |
| 2007/0023697 | A1 * | 2/2007 | Purser et al. | 250/492.21 |

OTHER PUBLICATIONS

International Search Report for PCT/US2007/008784 dated Oct. 16, 2007.

* cited by examiner

*Primary Examiner*—Nikita Wells
*Assistant Examiner*—Johnnie L Smith
(74) *Attorney, Agent, or Firm*—Eschweiler & Associates, LLC (57) ABSTRACT

One embodiment of the invention relates to a method for adjusting the ribbon beam flux of a scanned ion beam. In this method, an ion beam is scanned at a scan rate, and a plurality of dynamic beam profiles are measured as the ion beam is scanned. A corrected scan rate is calculated based on the plurality of measured dynamic beam profiles of the scanned beam. The ion beam is scanned at the corrected scan rate to produce a corrected ribbon ion beam. Other methods and systems are also disclosed.

19 Claims, 7 Drawing Sheets

ION BEAM SCANNING CONTROL METHODS AND SYSTEMS FOR ION IMPLANTATION UNIFORMITY

REFERENCE TO RELATED APPLICATIONS

This application claims the benefit of U.S. Provisional Application No. 60/790,751, filed Apr. 10, 2006 the contents of which are herein incorporated by reference in their entirety.

FIELD OF THE INVENTION

The present invention relates generally to ion implantation systems, and more specifically to improved systems and methods for uniformly scanning ion beams across a workpiece.

BACKGROUND OF THE INVENTION

In the manufacture of semiconductor devices and other products, ion implantation is used to dope semiconductor wafers, display panels, or other workpieces with impurities. Ion implanters or ion implantation systems treat a workpiece with an ion beam, to produce n or p-type doped regions or to form passivation layers in the workpiece. When used for doping semiconductors, the ion implantation system injects a selected ion species to produce the desired extrinsic material, wherein implanting ions generated from source materials such as antimony, arsenic or phosphorus results in n-type extrinsic material wafers, and implanting materials such as boron, gallium or indium creates p-type extrinsic material portions in a semiconductor wafer.

In general, it is desirable to provide uniform implantation of the surface of the workpiece. Accordingly, conventional systems often undergo a calibration operation to adjust a voltage waveform of a beam scanner to counteract the focal variation of the beam along the scan direction and/or to compensate for other beam irregularities. This is typically done in a point-to-point fashion by subdividing the profile region and the scanner voltage range into a series of discrete points that are equally spaced throughout the profile. For each discrete point, a measurement sensor is located at the point, and the scanned beam flux is measured at the point. After each measurement is completed, the measurement sensor steps to the next point, and then stops and performs another measurement. Such measurements are then repeated for each of the points, and the final scan waveform is adjusted to compensate for profile non-uniformities by assuming either a point beam or a beam profile constant across the scan.

Although the conventional point-to-point scanner calibration techniques may be adequate where the width of the ion beam is both narrow and relatively constant across the target area, these techniques are less suitable in the case of wider beams and/or in situations where the beam width varies along the scan direction. In particular, if the beam is wide and/or variable across the target area, the point-to-point technique fails to account for the workpiece dose produced by the beam some distance from the beam center. This situation is particularly problematic with low energy ion beams that experience space charge expansion (e.g., lateral divergence in the scan or X direction).

In addition, conventional point-to-point scanner calibration techniques require a considerable amount of time to obtain sufficient data. Typically, in conventional systems, the point-to-point measurements discussed above are taken over a number of beam passes in the X-direction. Because each beam pass may take several seconds, these conventional systems may often take several minutes to perform a single calibration. In scenarios where an ion implanter is recalibrated after a limited number of wafers (e.g., prototypes, test structures, etc.), this long calibration time significantly and adversely affects processing throughput.

Accordingly there is a need for improved ion beam scanner calibration techniques by which uniform implantation can be facilitated, in a reduced calibration time.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

One embodiment of the invention relates to a method for adjusting the ion flux of a ribbon ion beam. In this method, an ion beam is scanned at a scan rate to make a ribbon beam, and a plurality of dynamic beam profiles is measured as the ion beam is scanned. A corrected scan rate is calculated based on the plurality of measured dynamic beam profiles of the scanned ion beam. The ion beam is scanned at a corrected scan rate to produce a corrected ribbon ion beam.

The following description and annexed drawings set forth in detail certain illustrative aspects and implementations of the invention. These are indicative of but a few of the various ways in which the principles of the invention may be employed.

DETAILED DESCRIPTION OF THE INVENTION

The present invention will now be described with reference to the drawings wherein like reference numerals are used to refer to like elements throughout, and wherein the illustrated structures are not necessarily drawn to scale.

Figure 1A:
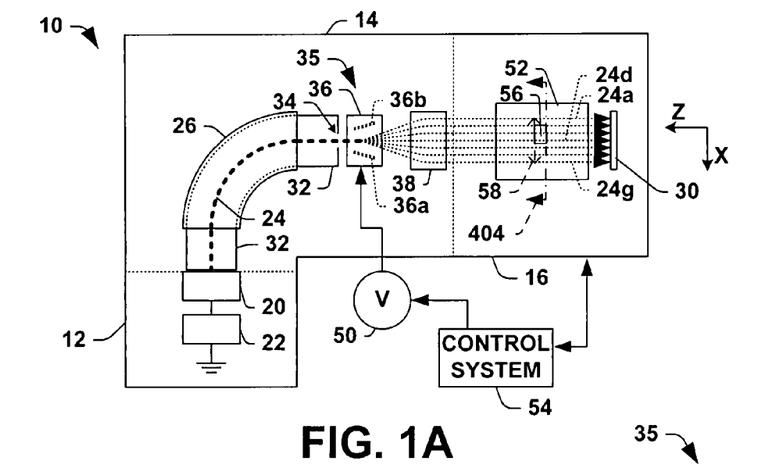
FIG. 1A is one embodiment of an ion implantation system with a scanner, parallelizer, and dosimetry system.

FIG. 1A illustrates an exemplary ion implantation system 10 having a terminal 12, a beamline assembly 14, and an end station 16.

The terminal 12 includes an ion source 20 powered by a high voltage power supply 22 that produces and directs an ion beam 24 to the beamline assembly 14. The ion source 20 generates ions that are extracted from the source 20 and formed into the ion beam 24, which is directed along a beam path in the beamline assembly 14 to the end station 16.

The beamline assembly 14 has a beamguide 32, a mass analyzer 26 in which a dipole magnetic field is established to pass only ions of appropriate charge-to-mass ratio through a resolving aperture 34, a scanning system 35, and a parallelizer 38. The ion implantation system 10 may also include various beam forming and shaping structures extending between the ion source 20 and the end station 16, which maintain the ion beam 24 and bound an elongated interior cavity or passageway through which the beam 24 is transported to the workpiece 30 supported in the end station 16. This ion beam transport passageway is typically kept at vacuum to reduce the probability of ions being deflected from the beam path through collisions with air molecules.

The implanter 10 may employ different types of end stations 16. For example, "batch" type end stations can simultaneously support multiple workpieces 30 on a rotating support structure, wherein the workpieces 30 are rotated through the path of the ion beam until all the workpieces 30 are completely implanted. A "serial" type end station, on the other hand, supports a single workpiece 30 along the beam path for implantation, wherein multiple workpieces 30 are implanted one at a time in serial fashion, with each workpiece 30 being completely implanted before implantation of the next workpiece 30 begins.

The illustrated end station 16 is a "serial" type end station that supports a single workpiece 30 along the beam path for implantation (e.g., a semiconductor wafer, display panel, or other workpiece to be implanted with ions from the beam 24), wherein a dosimetry system 52 is situated near the workpiece location for calibration measurements prior to implantation operations. During calibration, the beam 24 passes through dosimetry system 52. The dosimetry system 52 includes one or more profilers 56 that may continuously traverse a profiler path 58, thereby measuring the profile of the scanned beams. In the illustrated dosimetry system 52, the profiler 56 includes a current density sensor, such as a Faraday cup, for measuring the current density of the scanned beam. The current density sensor moves in a generally orthogonal fashion relative to the scanned beam and thus typically traverses the width of the scan path. The dosimetry system 52 is operably coupled to the control system 54 to receive command signals therefrom and to provide measurement values thereto to implement the measurement aspects of the calibration method of the invention as described further herein.

The implanter 10 may employ different types of scanning systems. For example, electrostatic systems or magnetic systems could be employed in the present invention. FIG. 1A's illustrated embodiment shows an electrostatic scanning system 35 that includes a scanner 36 and a power supply 50 coupled to scanner plates or electrodes 36a and 36b, where the scanner 36 receives a mass analyzed ion beam 24 along the beam path from the mass analyzer 26 and provides a scanned beam 24 along the beam path to a parallelizer 38. The parallelizer 38 then directs the scanned beam 24 to the end station 16 such that the beam 24 strikes measurement sensor(s) of the dosimetry system 52 at a generally constant angle of incidence.

The scanner 36 receives a mass analyzed ion beam 24 having a relatively narrow profile (e.g., a "pencil" beam in the illustrated system 10), and a voltage waveform applied by the power supply 50 to the scanner plates 36a and 36b operates to scan the beam 24 back and forth in the X direction (the scan direction) to spread the beam 24 out into an elongated "ribbon" beam (e.g., a scanned beam 24), having an effective X direction width that may be at least as wide as or wider than the workpieces of interest. The scanned beam 24 is then passed through the parallelizer 38 that directs the beam toward the end station 16 generally parallel to the Z direction (e.g., generally perpendicular to the workpiece surface).

In a magnetic scanning system (not shown) a high current supply is connected to the coils of an electromagnet. The magnetic field is adjusted to scan the beam. For purposes of this invention, all different types of scanning systems are equivalent and the electrostatic system is used for illustration.

Figure 1B:
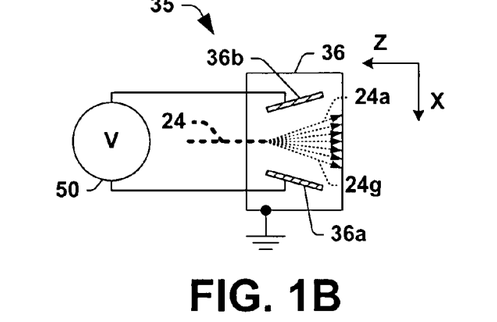
FIG. 1B is one embodiment of the scanner of FIG. 1A and several scanned ion beams.
Figure 1C:
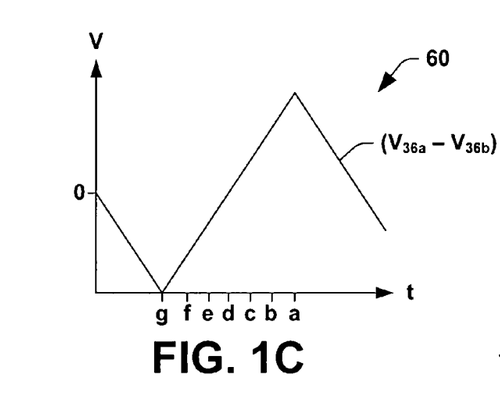
FIG. 1C is one embodiment of a triangular scanning plate voltage waveform in the scanner of FIGS. 1A and 1B.

Referring to FIGS. 1B-2F, the electrostatic version of the beam scanner 36 is further illustrated in FIG. 1B, having a pair of scan plates or electrodes 36a and 36b on either lateral side of the beam path, and a voltage source 50 that provides alternating voltages to the electrodes 36a and 36b, as illustrated in a waveform diagram 60 in FIG. 1C. The time-varying voltage between the scan electrodes 36a and 36b creates a time varying electric field across the beam path therebetween, by which the beam 24 is bent or deflected (e.g., scanned) along a scan direction (e.g., the X direction in FIGS. 1A, 1B, and 2B-2F). When the scanner electric field is in the direction from the electrode 36a to the electrode 36b (e.g., the potential of electrode 36a is more positive than the potential of electrode 36b, such as at times "e" and "g" in FIG. 1C), the positively charged ions of the beam 24 are subjected to a lateral force in the negative X direction (e.g., toward the electrode 36b). When the electrodes 36a and 36b are at the same potential (e.g., zero electric field in the scanner 36, such as at time "d" in FIG. 1C), the beam 24 passes through the scanner 36 unmodified. When the field is in the direction from the electrode 36b to the electrode 36a (e.g., times "a" and "c" in FIG. 1C), the positively charged ions of the beam 24 are subjected to a lateral force in the positive X direction (e.g., toward the electrode 36a).

Figure 1D:
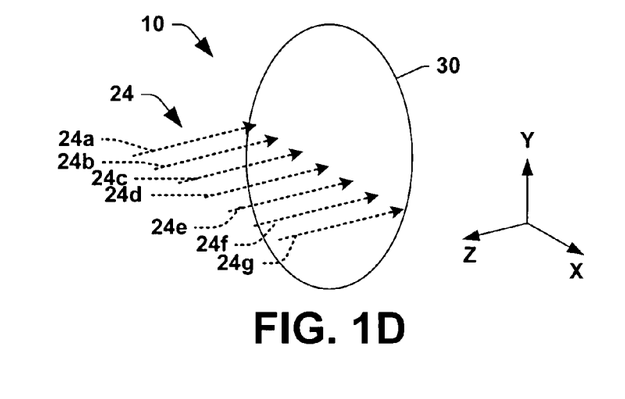
FIG. 1D is a perspective view illustrating one scanned ion beam striking a workpiece in the system of FIG. 1A at several discrete points in time.
Figure 2A:
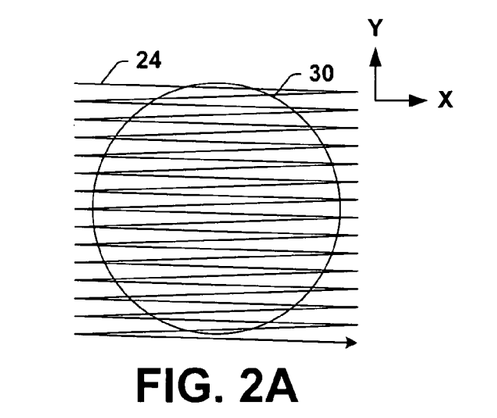
FIG. 2A is an end elevation view illustrating scanning of an ion beam across a workpiece.
Figure 2B:
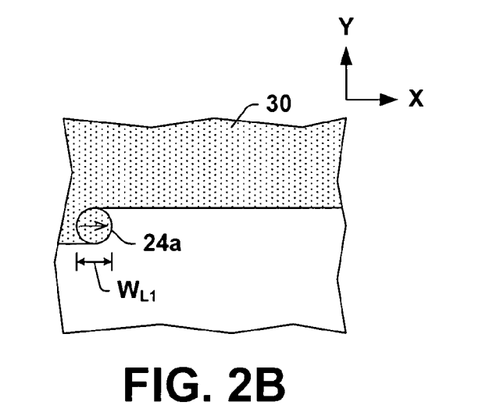
FIGS. 2B-2F are partial front elevation views illustrating variation in the ion beam width upon striking the workpiece in the ion implantation system of FIGS. 1A and 1B.

FIG. 1B shows the scanned beam 24 deflection as it passes through the scanner 36 at several discrete points in time during scanning prior to entering the parallelizer 38. FIG. 1D illustrates the scanned and parallelized beam 24 impacting the workpiece 30 at the corresponding times indicated in FIG. 1C. The scanned and parallelized ion beam 24a in FIG. 1D corresponds to the applied electrode voltages at the time "a" in FIG. 1C, and subsequently, the beam 24b-24g is illustrated in FIG. 1D for scan voltages at corresponding times "b"-"g" of FIG. 1C for a single generally horizontal scan across the workpiece 30 in the X direction. FIG. 2A illustrates a straightforward scanning of the beam 24 across the workpiece 30, wherein mechanical actuation (not shown) translates the workpiece 30 in the positive Y (slow scan) direction during X (fast scan) direction scanning by the scanner 36, whereby the beam 24 is imparted on the entire exposed surface of the workpiece 30.

Prior to entering the scanner 36, the ion beam 24 typically has a width and height profile of non-zero X and Y dimensions, respectively, wherein one or both of the X and Y dimensions of the beam typically vary during transport due to space charge and other effects. For example, as the beam 24 is transported along the beam path toward the workpiece 30, the beam 24 encounters various electric and/or magnetic fields and devices that may alter the beam width and/or height or the ratio thereof. In addition, space charge effects, including mutual repulsion of positively charged beam ions, tend to diverge the beam (e.g., increased X and Y dimensions), absent countermeasures.

Also, the geometry and operating voltages of the scanner 36 provide certain focusing properties with respect to the beam 24 that is actually provided to the workpiece 30. Thus, even assuming a perfectly symmetrical beam 24 (e.g., a pencil beam) entering the scanner 36, the bending of the beam 24 by the scanner 36 changes the beam focusing, wherein the incident beam typically is focused more at the lateral edges in the X direction (e.g., 24a and 24g in FIG. 1D), and will be focused less (e.g., wider or more divergent) in the X dimension for points between the lateral edges (e.g., 24c, 24d, and 24e in FIG. 1D).

Low energy implanters are typically designed to provide ion beams of a few thousand electron volts (keV) up to around 80-100 keV, whereas high energy implanters can employ RF linear acceleration (linac) apparatus (not shown) between the mass analyzer 26 and the end station 16 to accelerate the mass analyzed beam 24 to higher energies, typically several hundred keV, wherein DC acceleration is also possible. High energy ion implantation is commonly employed for deeper implants in the workpiece 30. Conversely, high current, low energy (high perveance) ion beams 24 are typically employed for high dose, shallow depth ion implantation, in which case the high perveance of the ion beam commonly causes difficulties in maintaining uniformity of the ion beam 24.

Figure 2C:
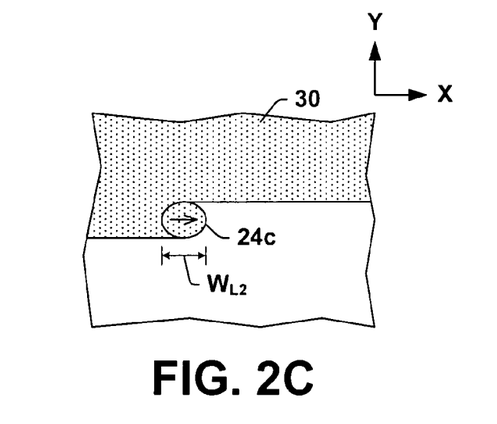
Figure 2D:
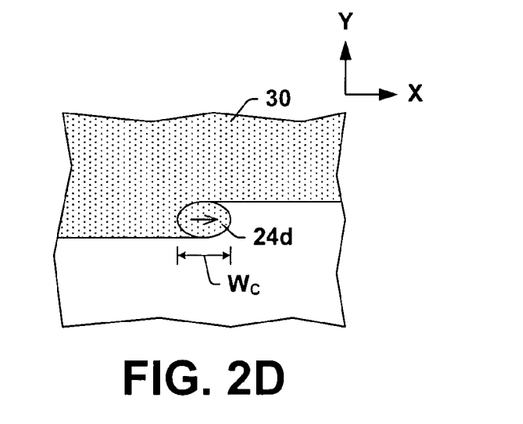
Figure 2E:
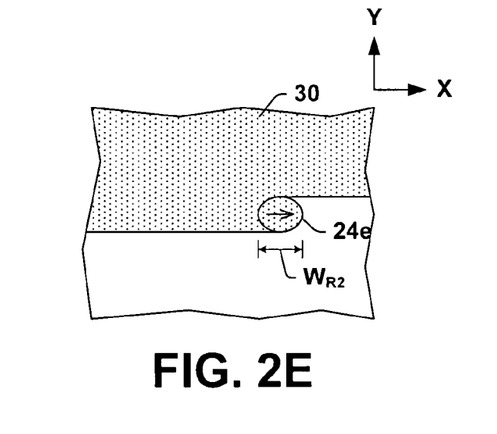
Figure 2F:
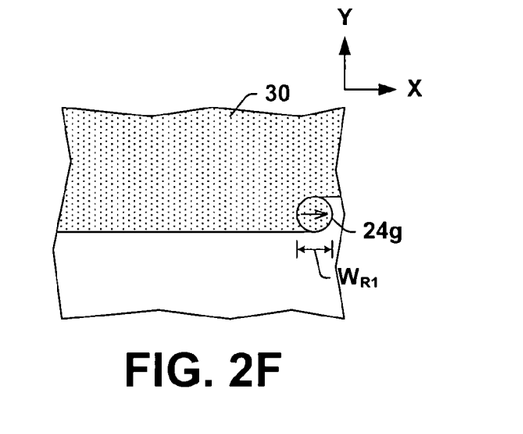

FIGS. 2B-2F illustrates an uncalibrated incident beam 24 as it scans across wafer 30. FIGS. 2B-2F correspond to the scanned instances of beam 24a, 24c, 24d, 24e, and 24g, respectively. As the uncalibrated beam is scanned across the wafer 30 in the X direction, the X direction focusing of the scanner 36 varies, leading to increased lateral defocusing of the incident beam 24 as it moves toward the center, and then improved focusing as the beam 24 again reaches the other lateral edge. For no scanning, the beam 24d proceeds directly to the center of the workpiece 30, at which the incident beam 24d has an X direction width $W_C$, as shown in FIG. 2D. As the beam 24 is scanned laterally in either direction away from the center, however, the time varying focusing properties of the scanner 36 lead to stronger lateral focusing of the incident beam. For instance, at the outermost edges of the workpiece 30, the incident beam 24a in FIG. 2B has a first left side width $W_{L1}$, and on the right side, the incident beam 24g in FIG. 2F has a first right side width $W_{R1}$. FIGS. 2C and 2E illustrate two intermediate beams 24c and 24e having incident beam widths $W_{L2}$ and $W_{R2}$, respectively, showing X direction focal variation between the edges and the center of the workpiece 30. Because these beam variations can lead to non-uniform doping in the workpiece, methods for calibrating the beam have been devised.

Figure 3:
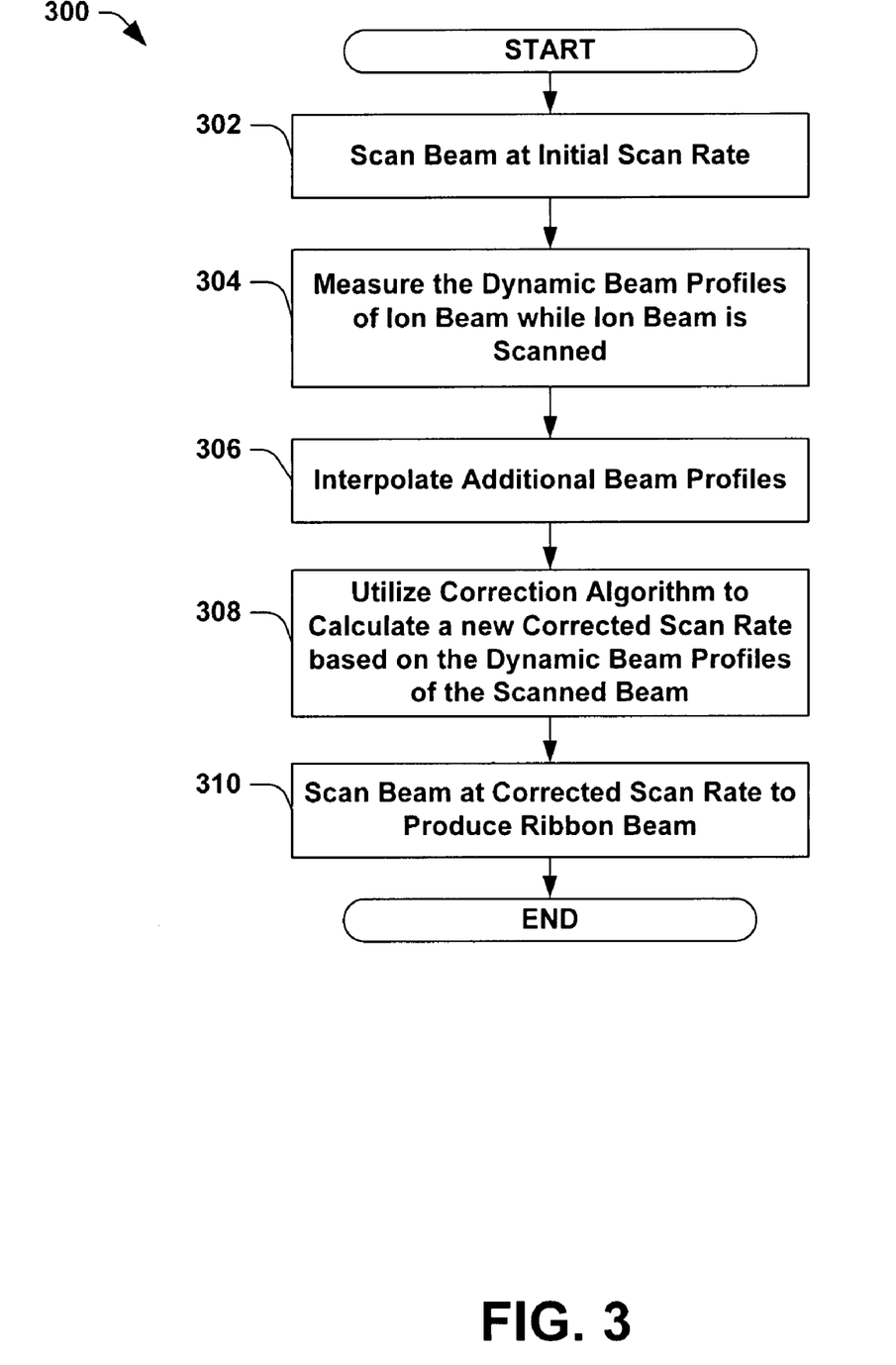
FIG. 3 is a flow diagram illustrating one calibration method in accordance with the invention.

While some aspects of the present invention may relate to one embodiment of an ion implanter system as described, other aspects relate to methods of profiling or calibrating an ion beam. For illustrative purposes, a general method for beam profiling 300 is illustrated in FIG. 3, while other more detailed methodologies are illustrated in FIGS. 4A-4C, FIGS. 5A-5D, FIGS. 6A-6B, and FIG. 7. While these methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects or embodiments of the present invention. Further, one or more of the acts depicted herein may be carried out in one or more separate acts and/or phases.

FIG. 3 shows one method 300 for adjusting the flux profile of a ribbon beam as taught by the current concept. In step 302, the beam is scanned at an initial rate. In step 304, the dynamic beam profiles of the ion beam are measured while the ion beam is being scanned. In step 306, additional dynamic beam profiles are interpolated based on the measured dynamic beam profiles. In step 308, a correction algorithm is used to calculate a corrected scan rate. This corrected beam is engineered to reduce undesirable flux variations, including but not limited to those previously discussed. Finally, in 310 the beam is scanned at a corrected scan rate to produce a ribbon beam showing the desired characteristics.

Figure 4A:
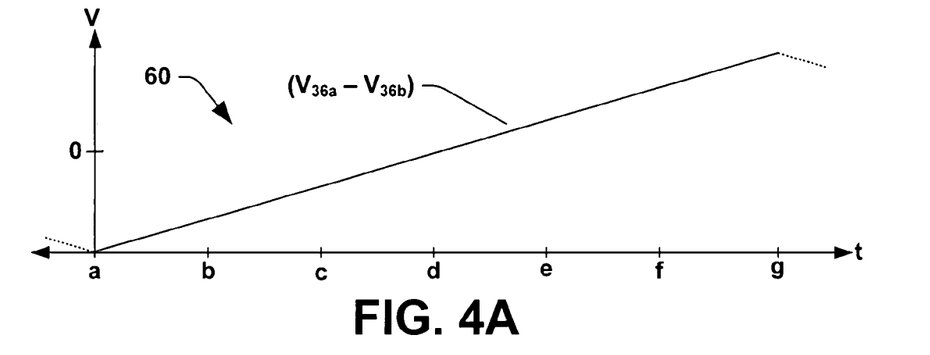
FIG. 4A-4C is a chart illustrating aspects of one measurement process that may be utilized in the calibration method of FIG. 3.
Figure 4B:
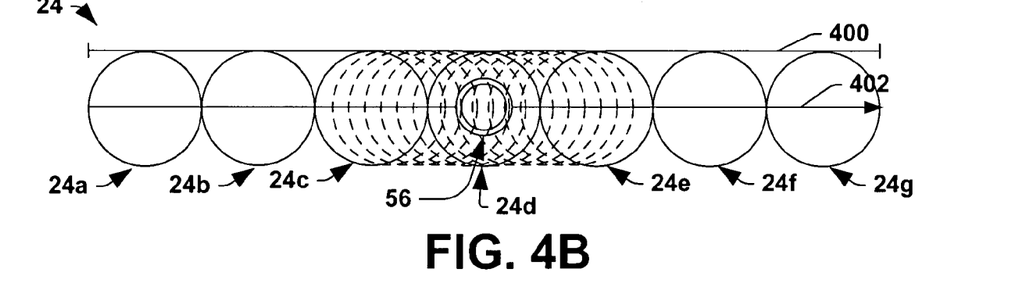
Figure 4C:
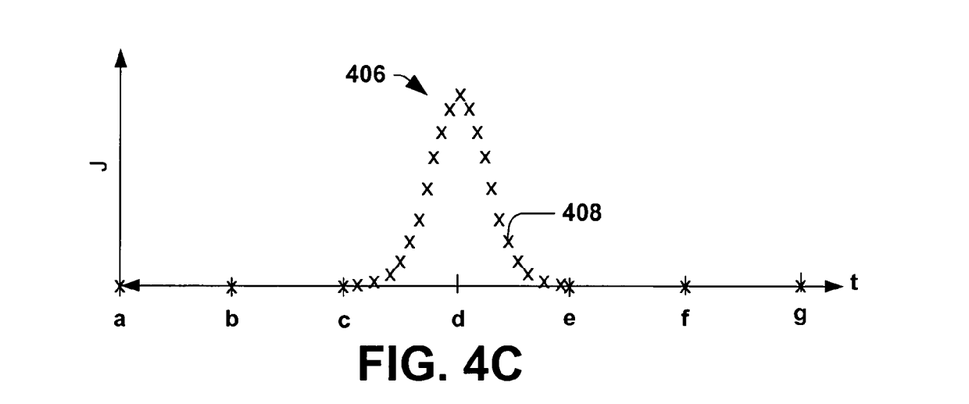

Graphs illustrating one method for measuring the dynamic beam profiles are shown in FIGS. 4A-4C, FIGS. 5A-D, and FIGS. 6A-6B. FIGS. 4A-4C, which illustrate a single pass of the beam 24 across the beam path 402, are intended to be read together, and show how the profiler 56 can measure a beam current signal 406 that corresponds to a single pass of the beam.

FIG. 4A shows one scan waveform 60 in the form of a voltage waveform that the scanner can apply to the beam 24 via plates 36a and 36b, although other waveforms may be used including but not limited to: magnetic waveforms, mechanical actuation waveforms, or other waveforms for moving the beam. Furthermore, such waveforms may be characterized by various functions, including, but not limited to: linear waveforms, non-linear waveforms, and sinusoidal waveforms.

FIG. 4B shows a cross-sectional view of aspects of the dosimetry system 52 of FIG. 1A cut along section line 404. As shown, the beam traverses the scan path 402, which is carved out by the beam as it is scanned and which has an associated scan path width 400. FIG. 4B shows several exemplary scanned ion beams (e.g., 24a, 24b, 24c, 24d, 24e, 24f, and 24g, as well as several intermediate scanned beams, i.e., dashed circles, that could occur between 24c and 24e). These scanned ion beams correlate to the waveform in FIG. 4A. For example, in FIG. 4A a relatively large negative voltage is applied on the plates at time "a", which corresponds to scanned ion beam 24a at the left portion of the scan path 402. Similarly, a substantially zero voltage is applied to the plates at time "d", which corresponds to scanned ion beam 24d at the center portion of scan path 402.

As the beam 24 is scanned across the scan path 402, portions of the beam 24 may pass through the profiler 56. In typical embodiments, the profiler 56 continuously traverses the profiler path 58 (see FIG. 1A) while the beam 24 traverses the scan path 402. Although the illustrated profiler has an area that is smaller than the area of the each beam, the present invention encompasses profilers having areas that are larger, smaller, or the same size of the beam. As illustrated in FIG. 4B-4C, in a single scan sweep, the illustrated profiler 56 measures a current density (J) distribution in the form of a beam current signal 406 represented by a series of discrete measurement points (e.g., 408). As shown, the current density of the beam current signal 406 is negligible when no portions of the beam pass through the profiler 56 (e.g., "24a", "24b", "24c", "24e", "24f", and "24g"). However, the current density of beam current signal 406 is non-negligible when portions of the beam pass through the profiler 56 (e.g., "24d", and series of "x" symbols corresponding to intermediate scanned beams between "24c" and "24e"). As one of skill in the art will appreciate, the illustrated current density of the beam current signal 406 does not in any way limit the scope of the present invention as various beams may be characterized by different beam current signals.

Figure 5A:
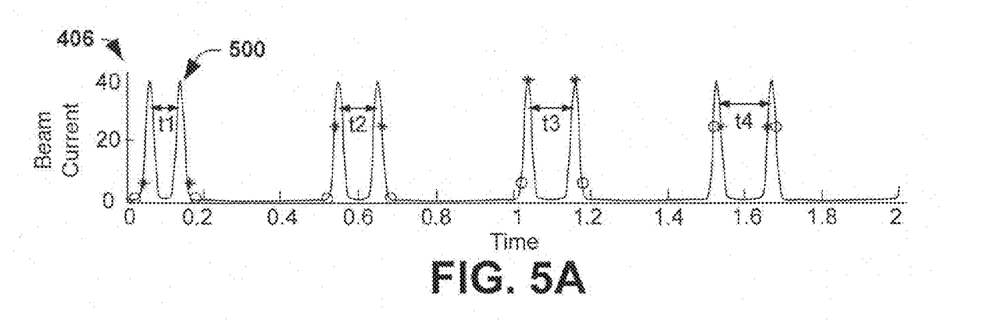
FIG. 5A-5D is a chart illustrating aspects of one measurement process that may be utilized in the calibration method of FIG. 3.
Figure 5B:
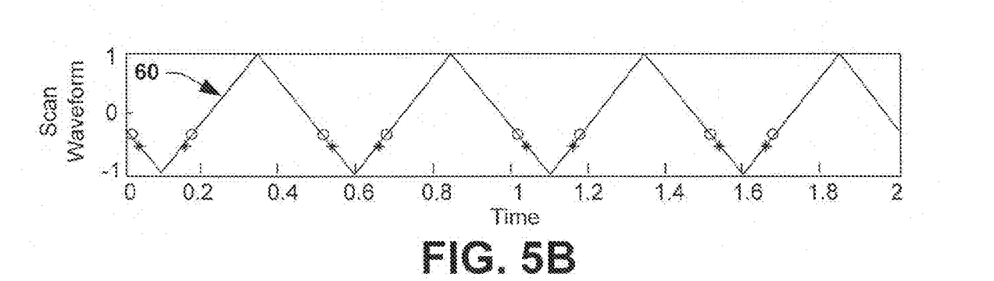

As shown in FIG. 5A, the beam profiler continues to measure the current beam signal 406 as the beam continues to scan back and forth across the beam path 402. Thus, in FIG. 5A, several peaks 500 are measured, where each peak corresponds to a single pass of the ion beam over the beam profiler. The points having the "*" symbol represent equal scan voltages, as do the points having the "o" symbol (see FIG. 5B).

Figures 5C, 5D:
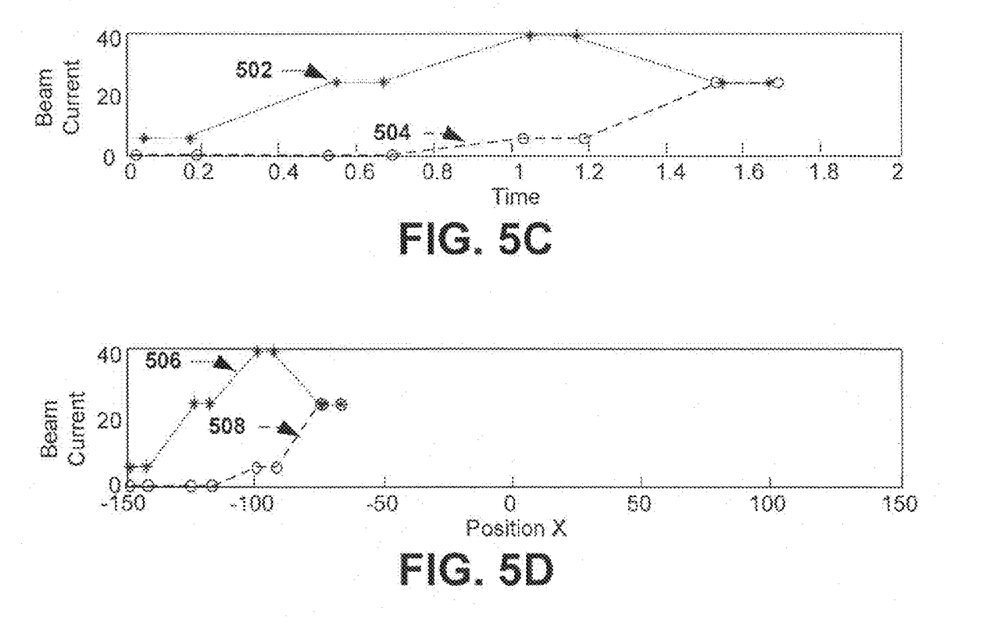

As shown in FIG. 5C, for each discrete scan voltage, the beam current is plotted as a function of time. Two resulting plots 502, 504 are shown. Such plots are referred to as dynamic beam profiles. As illustrated, each dynamic beam profile includes information related to the current density of the scanned beam at a particular scan voltage as a function of time. As shown in FIG. 5D, because the location of the profiler is known as a function of time, the dynamic beam profiles 506, 508 can also be plotted versus position or some other variable.

Figure 6A:
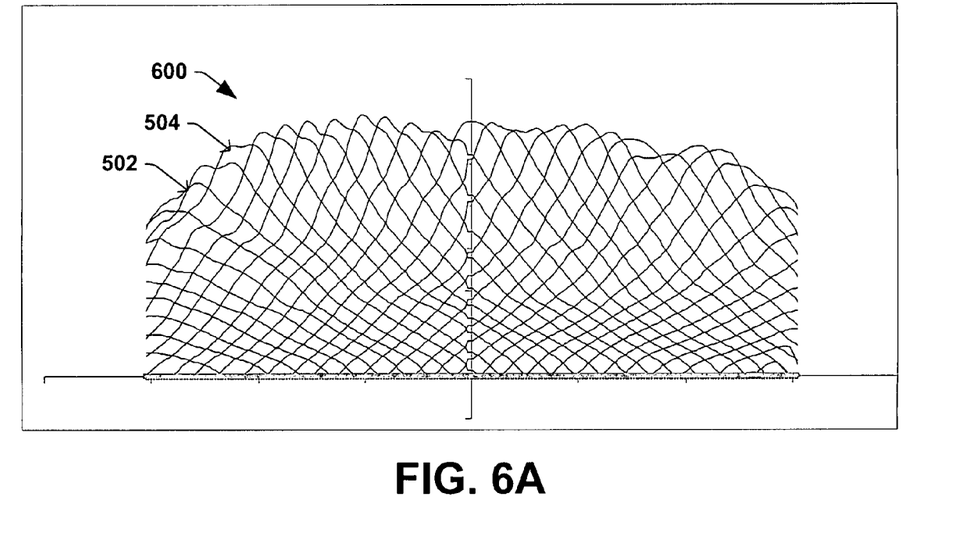
FIG. 6A-6B is a chart illustrating aspects of one measurement process that may be utilized in the calibration method of FIG. 3.

FIG. 6A shows a set 600 of dynamic beam profiles for a given scanned beam. It contains profiles for scan voltages which completely overscan the beam. For example, the set 600 includes dynamic profiles 502 and 504. The dynamic beam profiles may be stored in a profile matrix M where the columns of M are dynamic profiles at a single scan voltage and the rows of M are currents at a given location X for each of the scan voltages.

Figure 6B:
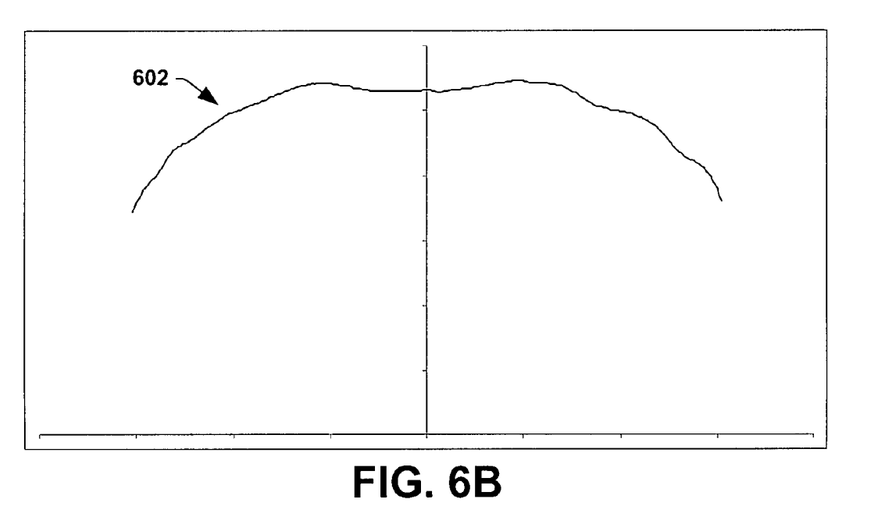

As shown in FIG. 6B, a ribbon flux profile 602, may be calculated by summing the columns of M. The ribbon flux profile is more accurately calculated by binning the many beam signals and converting time to X.

As previously shown in FIG. 3, the calibration method 300 may also include a step of interpolating additional dynamic beam profiles 306. For example, if ten dynamic beam profiles are measured, a user could interpolate them into one hundred or one hundred and fifty profiles in order to allow a more accurate determination of the corrected scan rate. In typical embodiments, this step includes forming a profile matrix M that includes both the dynamic beam profiles and the interpolated profiles. For example, each row of the matrix could relate to a dynamic beam profile at an approximate profiler position and each column could related to a dynamic profile at a given scan voltage. In embodiments that do not utilize the step of interpolating additional profiles, the profile matrix M will include dynamic beam profiles.

Figure 7:
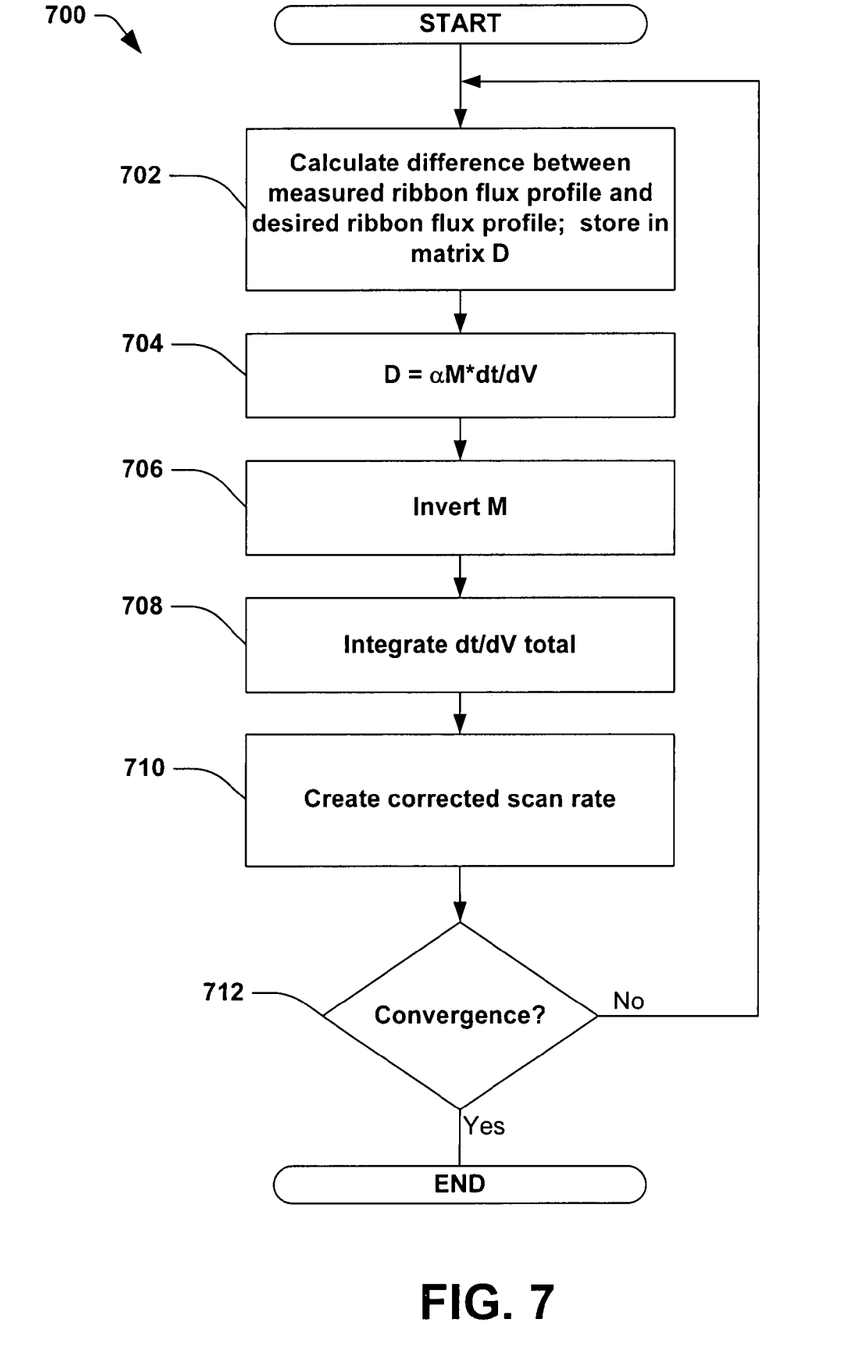
FIG. 7 is a chart illustrating one correction algorithm to calculate a set of correction factors.

The calibration method 300 also includes the step of utilizing an algorithm to calculate a corrected scan waveform. One such algorithm 700 is illustrated in FIG. 7. Other algorithms, for example based on linear or non-linear regression methods, could also be used.

In step 702, the difference between the ribbon flux profile and a desired ribbon flux profile is calculated. The result is stored in vector D. Typically, the desired ribbon flux profile corresponds to a profile with a constant current density across the scan path. Such a constant current density likely results in a uniform doping of the workpiece. In split implants, the desired ribbon flux profile may be two or more segments of constant current density regions with different current densities.

In step 704, vector D is proportionate to the profile matrix M multiplied by the inverse of the instantaneous scan speed change (e.g., $\Delta dt/dV$). In step 706, the profile matrix M is inverted. In step 708, $dt/dV+\Delta dt/dV$ is integrated. This integration may be constrained such that the new $dt/dV$ is positive and less than the bandwidth of the scanner. In step 710, the corrected scan waveform is calculated by inverting $t(V)$ to give $V(t)$, and scaling appropriately.

In step 712, a determination is made if the algorithm has converged. Convergence is typically defined as a percent non-uniformity of the flux. This non-uniformity is user settable and may be, for example, less than 1.5%. In various embodiments, the non-uniformity will be less than 0.5% (one-half percent). If the beam flux profile converges, then calibration is complete and the beam can be scanned at a corrected scan speed to produce a corrected ribbon beam (see FIG. 3). If the algorithm has not converged, then steps 702-712 are repeated until convergence occurs or until the calibration times out.

For each calibration, the ion implanter 10 is typically configured such that a user can select a unique x-resolution for the beam current signal 406. This x-resolution is the number of discrete measurement points 408 per unit measure. A user may choose a particular x-resolution based on any number of factors, including but not limited to: memory considerations, bandwidth concerns, throughput concerns, calibration speed, calibration accuracy, and/or calibration precision.

For each calibration, the ion implanter 10 is typically configured such that a user can select a unique x-resolution for the dynamic profiles, 502 and 504. A user may choose a particular x-resolution based on any number of factors, including but not limited to: memory considerations, bandwidth concerns, throughput concerns, calibration speed, calibration accuracy, and/or calibration precision. In general, the x-resolution of the dynamic profiles may be determined by the scan rate and the profiler rate, and may relate to a digitization rate of the profiler by the following relations: number of dynamic beam profiles is equal to the digitization frequency divided by the beam scanning frequency, and x-resolution or number of points per dynamic beam profile is equal to beam profiling time times the beam scanning frequency.

As previously mentioned, in various embodiments, the scan rate of the beam 24 is sufficiently higher than the profiling rate of the profiler 56. For example, the scan rate of the beam may be faster than the profiling rate of the profiler by a factor in the range of about 20 to about 10,000. In a particular embodiment, the scan rate may be faster than the profiling rate by a factor of about 2,000. As one of ordinary skill in the art will appreciate, the invention is not limited to the above values, but rather encompasses any ratio of scan rate to profiling rate.

In addition, in various embodiments, the step of measuring the plurality of dynamic beam profiles need not be performed to correct the ribbon flux of the beam. For example, the dynamic beam profiles could also be measured in various diagnostic modes, or in other scenarios where it is desirable to measure a ribbon beam profile.

In addition, in various embodiments, the step of measuring the plurality of dynamic beam profiles is performed in a limited time. For example, in one embodiment the limited time is less than 90 seconds. In another embodiment, the limited time is less than 60 seconds, or even less than 30 seconds. In still another embodiment, the limited time is less than 15 seconds. In these and/or other embodiments, the limited time is less than a time that relates to the profiler 56 moving across the profiler path 58. For example the limited time may be less than ten passes of the profiler, less than five passes of the profiler, less than three passes of the profiler, or one pass of the profiler. As one of ordinary skill in the art will appreciate, the invention is not limited to the above values, but rather encompasses all temporal values and movements across the profiler path.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. A method for measuring the flux of a ribbon ion beam, comprising:
providing a scan waveform having a time-varying potential to scan an ion beam across a scan path, wherein a first value of the time-varying potential corresponds to a first location of the ion beam on the scan path and a second value of the time-varying potential corresponds to a second location of the ion beam on the scan path;
measuring a beam current signal comprising a plurality of beam current values as the ion beam is scanned across the scan path; and
assigning beam current values from the beam current signal and corresponding to the first value to a first dynamic beam profile; and
assigning beam current values from the beam current signal and corresponding to the second value to a second dynamic beam profile.

2. The method of claim 1 wherein the time-varying potential relates to at least one of: a time-varying voltage or a time-varying magnetic field.

3. A method for adjusting the flux of a ribbon ion beam, comprising:
providing a scan waveform having a time-varying potential to scan an ion beam across a scan path at an initial scan rate, wherein a first value of the time-varying potential corresponds to a first location of the ion beam on the scan path and a second value of the time-varying potential corresponds to a second location of the ion beam on the scan path;
moving a beam profiler at a profiling rate across a profiling path that at least partially overlaps the scan path;
measuring with the beam profiler as the ion beam is scanned a beam current signal comprising a plurality of beam current values;
assigning beam current values from the beam current signal and corresponding to the first value to a first dynamic beam profile;
assigning beam current values from the beam current signal and corresponding to the second value to a second dynamic beam profile; and
calculating a corrected scan rate that differs from the initial scan rate based on the first and second dynamic beam profiles.

4. The method of claim 3, further comprising:
scanning the ion beam at the corrected scan rate to produce a corrected ribbon ion beam.

5. The method of claim 3, wherein calculating the corrected scan rate based on the first and second dynamic beam profiles comprises:
(a) processing the dynamic beam profiles to generate a ribbon beam flux profile;
(b) calculating a difference between the ribbon beam flux profile and a desired ribbon beam flux profile;
(c) relating the difference in (b) to the dynamic beam profiles by an instantaneous scan velocity; and
(d) calculating a the corrected scan rate based on the relationship in (c).

6. The method of claim 5, wherein calculating a corrected scan rate based on the dynamic beam profiles further comprises:
determining if the ribbon flux profile meets requirements; and
if the ribbon beam flux profile does not meet the requirements, repeating acts (a), (b), (c), and (d) until it does meet the requirements.

7. The method of claim 3, wherein a plurality of dynamic beam profiles are measured in a limited time.

8. The method of claim 7, wherein the limited time is less than 90 seconds.

9. The method of claim 7, wherein the limited time is less than 15 seconds.

10. The method of claim 7, wherein the limited time is less than a time that corresponds to three passes of the beam profiler across the profiling path.

11. The method of claim 7, wherein the limited time is less than or approximately equal to a time that corresponds to a single pass of the beam profiler across the profiling path.

12. The method of claim 4, further comprising: interpolating additional dynamic beam profiles from the measured dynamic beam profiles.

13. A calibration system for calibrating an ion beam scanned in an ion implantation system, the calibration system comprising:
a beam scanner adapted to utilize a time-varying scan waveform to scan an ion beam across a scan path;
a beam profiler adapted to traverse a profiling path which at least partially overlaps the scan path and measure a beam current of the scanned ion beam; and
a controller adapted to assign beam current measurements corresponding to a first value of the time-varying scan waveform to a first dynamic beam profile, and assign beam current measurements corresponding to a second value of the time-varying scan waveform to a second dynamic beam profile.

14. The calibration system of claim 13, wherein the beam scanner is adapted to scan the ion beam at a scan rate which is higher than a profiling rate at which the beam profiler travels along the profiling path.

15. The calibration system of claim 13, wherein the controller is further adapted to process the dynamic beam profiles to generate a ribbon flux profile indicative of the flux of the ion beam as the ion beam is scanned across the scan path.

16. The calibration system of claim 15, wherein the controller is further adapted to compare the ribbon flux profile to a desired ribbon flux profile and provide a correction signal to the beam scanner to alter the scan waveform so the ribbon flux profile conforms to the desired ribbon flux profile.

17. The method of claim 1, further comprising:
processing the plurality of dynamic beam profiles to obtain a ribbon flux profile; and
comparing the ribbon flux profile to a desired beam profile.

18. The method of claim 17, further comprising:
calculating a corrected scan rate based on the comparison of the ribbon flux profile to the desired beam profile.

19. The method of claim 18, further comprising:
scanning the ion beam at the corrected scan rate to produce a ribbon beam with the desired beam profile.

* * * * *